US006674354B2

(12) United States Patent
Hasegawa

(10) Patent No.: US 6,674,354 B2
(45) Date of Patent: Jan. 6, 2004

(54) NON-RECIPROCAL CIRCUIT ELEMENT, COMMUNICATION DEVICE, AND METHOD OF MANUFACTURING NON-RECIPROCAL CIRCUIT ELEMENT

(75) Inventor: Takashi Hasegawa, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 44 days.

(21) Appl. No.: 10/119,415

(22) Filed: Apr. 8, 2002

(65) Prior Publication Data

US 2002/0145496 A1 Oct. 10, 2002

(30) Foreign Application Priority Data

Apr. 10, 2001 (JP) ........................................ 2001-111891

(51) Int. Cl.[7] ................................................ H01F 5/00
(52) U.S. Cl. .......................... 336/200; 336/83; 333/1.1
(58) Field of Search ...................... 336/83, 192, 90–96, 336/200; 333/1.1, 24.2

(56) References Cited

U.S. PATENT DOCUMENTS 5,159,294 A * 10/1992 Ishikawa et al. ............. 333/1.1
5,745,015 A * 4/1998 Tokudera et al. ............ 333/1.1

* cited by examiner

Primary Examiner—Tuyen T. Nguyen
(74) Attorney, Agent, or Firm—Keating & Bennett, LLP

(57) ABSTRACT

A non-reciprocal circuit element has a metallic component and a resin component combined with the metallic component. Connection electrodes are integrated with the resin component. A permanent magnet is disposed in a region defined by the metallic component. Center electrodes are disposed in a region defined by the resin component and the metallic component. The center electrodes are connected to the connection electrodes with solder (colored gray). The resin component is formed of a white liquid crystalline polymer and the connection electrodes are plated with silver. The connection electrodes and the resin component, therefore, have light reflectances higher than that of the solder. By setting a threshold for binarization between the level of the reflection at the solder and the level of the reflection at the connection electrodes, the amount of applied soldering paste can be determined with an image analyzer.

9 Claims, 15 Drawing Sheets

US 6,674,354 B2

NON-RECIPROCAL CIRCUIT ELEMENT, COMMUNICATION DEVICE, AND METHOD OF MANUFACTURING NON-RECIPROCAL CIRCUIT ELEMENT

BACKGROUND OF THE INVENTION

1. Field of the Invention

The present invention relates to non-reciprocal circuit elements, communication devices, and methods of manufacturing the non-reciprocal circuit elements.

2. Description of the Related Art

Non-reciprocal circuit elements for lumped-constant isolators used in mobile communication devices, such as cellular phones, generally have a function for transmitting signals in one direction and preventing the transmission in the other direction. A non-reciprocal circuit element comprises a permanent magnet, a center electrode assembly including a ferrite and a plurality of center electrodes disposed on the ferrite. The magnet is disposed in a region defined by a metallic component and the center electrode assembly is disposed in a region defined by a resin component combined with the metallic component.

FIG. 20 is a plan view of a resin component 3. The resin component 3 is combined with a lower metallic component 4 to form a case. A bottom 3a of the resin component 3 is provided with connection electrodes (an input-lead-out electrode 14a, an output-lead-out electrode 15a, and an intermediary electrode 17) electrically connected to center electrodes. The bottom 3a has windows to define a first cell 3c and second cells 3d, and the lower metallic component 4 is exposed in the first and second cells 3c and 3d to serve as grounding-lead-out electrodes 4a. One grounding-lead-out electrode 4a exposed in the first cell 3c which is in the center of the bottom 3a is electrically connected to a grounding electrode of the center electrode assembly. The other grounding-lead-out electrodes 4a exposed in the second cells 3d are electrically connected to electrical functional components such as matching capacitors. These connections are ensured by, for example, a soldering paste 60. The soldering paste 60 is applied to the electrodes 4a, 14a, 15a, 17, and the like with a dispenser. The soldering paste 60 may consist essentially of Sn—Sb, Sn—Pb, or Sn—Ag, for example. The surface color of the soldering paste is gray.

The lower metallic component 4, which serves as the grounding-lead-out electrodes 4a, and the connection electrodes 14a, 15a, and 17 are formed by nickel plating (typically 1 µm thick) and silver plating (typically 4 µm thick), in that order, on base iron. The surface color of the electrodes 4a, 14a, 15a and 17 is silver.

The resin component 3 is formed of a liquid crystalline polymer. Liquid crystalline polymers are originally white, but the polymer used for the resin component 3 contains a black colorant in order to hide dirt thereon.

Mobile communication devices are increasingly required to be small and inexpensive and to have improved reliability in use. Hence, isolators, or non-reciprocal circuit elements, used for the communication devices also must be small and inexpensive, and have improved reliability. Accordingly, the electrical functional components and the resin component 3 included in the non-reciprocal circuit elements are required to be small.

Unfortunately, if the resin component 3 and the electrical functional components are directly miniaturized, the miniaturized resin component 3 and electrical functional components are likely to cause soldering problems at the connection electrodes 14a, 15a, and 17 and at the electrodes of the electrical functional components. For example, the use of too little soldering paste 60 is liable to cause an open circuit at the connection electrodes 14a, 15a, and 17 and matching capacitors. Also, the use of too much soldering paste 60 (see the soldering paste 60 applied on the connection electrode 15a in FIG. 20) is liable to cause a short circuit because the soldering paste 60 comes into contact with undesired areas.

In order to prevent any open circuit and short circuit in the non-reciprocal circuit element, the soldering paste 60 must be applied to the connection electrodes 14a, 15a and 17 and electrodes of the electrical functional components while being controlled within a predetermined range. Controlling the amount of soldering paste 60 becomes increasingly important according to the miniaturization of the non-reciprocal circuit element. For controlling the amount of soldering paste 60, visual examination and image analysis may be performed. However, visual examination is inefficient, and therefore is not suitable for mass production.

In contrast, image analysis is efficient and suitable for mass production. Generally, exposing an object to visible light causes reflection, at the surface of the object, having an intensity in proportion to the light reflectance of the object. The intensity of the reflection is determined by an image pickup tube, and an output of the image pickup tube can be processed to form an image. In this image, a white image represents an area causing a strong reflection and a black image represents an area causing a weak reflection. In other words, when an object is exposed evenly to a substantially constant visible light, an area forming a white image has a high light reflectance and, in contrast, an area forming a black image has a low light reflectance. In this image analysis, the image is binarized according to two levels which indicate black and white, respectively, and thus the amount of soldering paste 60 is determined according to the binarized image.

However, if the threshold for the black-and-white binarization is set between the image formed by the reflection at the soldering paste 60 and the images formed by the reflections at the connection electrodes 14a, 15a, and 17, the soldering paste 60 and the resin component 3 are not distinguished from each other.

More specifically, the reflections at the connection electrodes 14a, 15a, and 17 are the strongest, the reflection at the soldering paste 60 is the second strongest, and the reflection at the resin component 3 is the weakest because surface colors of the connection electrodes 14a, 15a, and 17, the soldering paste 60, and the resin component 3 are silver, gray, and black, respectively. Therefore, if the threshold for the binarization of the image is set between the image formed by the reflection at the soldering paste 60 and the images formed by the reflections at the connection electrodes 14a, 15a, and 17, the soldering paste 60 and the resin component 3 are not distinguishable from each other. Hence, it is impossible to detect when soldering paste 60 is spreading to the connection electrode 15a, nor consequently can it be determined whether the soldering paste 60 is applied within a predetermined range.

For a solution of this problem, it has been suggested that two thresholds be set. A first threshold is set between the image formed by the reflection at the resin component 3 and the image formed by the reflection at the soldering paste 60, and a second threshold is set between the image formed by the reflection at the soldering paste 60 and the image formed by the reflections at the connection electrodes 14a, 15a, and 17. Thus, the soldering paste 60 can be distinguished from the connection electrodes 14a, 15a, 17 and the resin component 3. However, this solution requires an expensive image analyzer and therefore leads to expensive non-reciprocal circuit elements.

SUMMARY OF THE INVENTION

Accordingly, the present invention provides a miniaturized, inexpensive, and reliable non-reciprocal circuit element and communication device and a method of manufacturing the non-reciprocal circuit element.

To this end, according to one aspect of the present invention, there is provided a non-reciprocal circuit element comprising:

a metallic component, a resin component combined with said metallic component, a ferrite, a permanent magnet, which applies a DC magnetic flux to the ferrite, and a center electrode assembly comprising a plurality of center electrodes which are disposed on the ferrite, wherein:

the resin component accommodates the center electrode assembly, the resin component has connection electrodes which are connected to the center electrodes by solder, the metallic component accommodates the permanent magnet and the center electrode assembly, and respective light reflectances of both the connection electrodes and the resin component are higher than that of the solder.

Preferably, the color of the resin component is white or non-black so that the light reflectance of the connection electrode is the same as or higher than that of the resin component, and the light reflectance of the resin component is higher than that of the solder, or the light reflectance of the resin component is higher than that of the connection electrode, and the light reflectance of the connection electrode is higher than that of the solder.

In other words, the color of the resin component is preferably white or non-black so that the light reflectance of the resin component is higher than that of the solder.

The present invention is further directed to a non-reciprocal circuit element in which both a light reflectance of the connection electrodes and a light reflectance of the resin component are lower than that of the solder.

In another aspect of the present invention, a method of manufacturing a non-reciprocal circuit element includes a step of applying a predetermined amount of soldering paste to each of predetermined positions on connection electrodes in a resin component, a step of determining the amount of soldering paste applied to each connection electrode with an image analyzer, and a step of disposing a center electrode assembly on a predetermined position in the resin component and connecting the center electrodes with the connection electrodes with the solder paste.

The invention is further directed to a method of manufacturing a non-reciprocal circuit element in which both a light reflectance of the connection electrodes and a light reflectance of the resin component are either higher or lower than that of the solder.

In another aspect of the present invention, a method of manufacturing a non-reciprocal circuit element includes a step of applying a predetermined amount of soldering paste to each of predetermined positions on connection electrodes in a resin component, a step of determining the amount of soldering paste applied to each connection electrode with an image analyzer, a step of disposing electrical functional components on predetermined positions in the resin component, a step of applying a predetermined amount of soldering paste to each of predetermined positions on the electrodes of the functional components, a step of determining the amount of soldering paste applied to each electrode of the functional components with an image analyzer, and a step of disposing a center electrode assembly including center electrodes on a predetermined position in the resin component and connecting the center electrodes of the center electrode assembly with the electrodes of the electric functional components with a soldering paste.

Further, the light reflectance of the connection electrodes and resin component respectively are higher than that of the soldering paste, and the threshold for the black-and-white binarization is set between the image formed by the light reflectance of the solder paste and that of the connection electrodes and resin component. Thus, the solder paste can be distinguished from the connection electrodes and the resin component.

In addition, in the same way, the solder paste can also be distinguished if the light reflectances of the connection electrodes and resin component respectively are lower than that of the solder paste.

Preferably, the resin component is formed of a colorant-free resin. By not needing to add colorant to the resin, the manufacturing cost of the resin component can be reduced.

Preferably, the resin component is formed of a material selected from the group consisting of liquid crystalline polymers, polyphenylene sulfide, and poly (ether-ether-ketone). These materials are thermostable and have low dielectric loss factors.

Preferably, the connection electrodes are coated with silver, which has a high conductivity. Thus, the insertion loss of the non-reciprocal circuit element can be low. In addition, the use of silver leads to rustproof and solder-wettable connection electrodes.

The non-reciprocal circuit element may further comprise matching capacitors. In this instance, preferably, the surface material of the capacitor electrodes is the same as that of the connection electrodes. Thus, the thresholds for the determination of the amounts of soldering paste applied to the connection electrodes and that applied to the electrodes of the capacitors can be set at the same value, and therefore process control can be facilitated.

Preferably, the amounts of soldering paste are determined according to reflected images which are binarized by a monochrome image analyzer. Since monochrome image analyzers are inexpensive, the cost of the manufacturing facilities can be reduced and therefore the manufacturing cost of the non-reciprocal circuit element can be reduced.

Also, the present invention is directed to a communication device comprising a non-reciprocal circuit element described above. In the communication device, problems such as open circuits and short circuits due to miniaturization of a non-reciprocal circuit element can be prevented with low cost, small-sized, and high reliability.

Other features and advantages of the present invention will become apparent from the following description of embodiments of the invention which refers to the accompanying drawings.

DESCRIPTION OF EMBODIMENTS OF THE INVENTION

Figure 1:
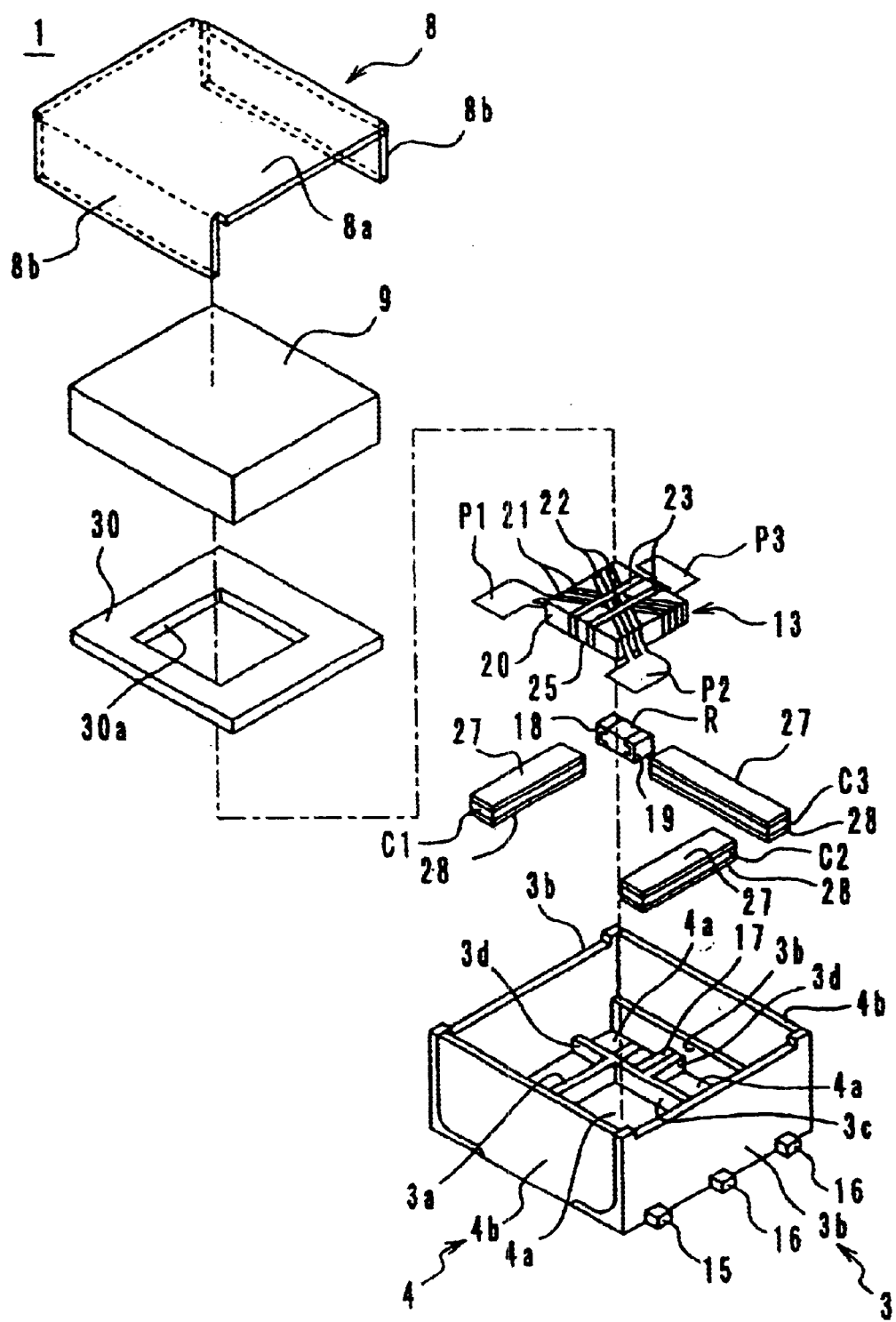
FIG. 1 is an exploded perspective view of a non-reciprocal circuit element according to a first embodiment of the present invention.

A non-reciprocal circuit element, a communication device, and a method of manufacturing the non-reciprocal circuit element according to the present invention will now be described with reference to drawings. In embodiments, the same parts are designated by similar reference numerals in the various drawings and descriptions of those parts are not repeated.

First Embodiment

FIGS. 1 to 10 show a first embodiment of a non-reciprocal circuit element according to the present invention. FIG. 1 is an exploded perspective view of the non-reciprocal circuit element 1. The non-reciprocal circuit is a lumped constant isolator.

As shown in FIG. 1, the non-reciprocal circuit element 1 comprises an upper metallic component 8, a lower metallic component 4, a resin component 3, a center electrode assembly 13, a permanent magnet 9, a resistive element R, matching capacitors C1, C2, and C3, and a resin member 30.

In the center electrode assembly 13, three center electrodes 21 to 23 intersect, at 120° with respect to each other, on the top surface of a rectangular microwave ferrite 20 with an insulating sheet (not shown) therebetween. One end of each of the center electrodes 21 to 23 serves as a corresponding one of the ports P1 to P3, and the ports P1 to P3 lie horizontally. The other ends of the electrodes 21 to 23 are connected with a common grounding electrode 25 on the under surface of the ferrite 20. The common grounding electrode 25 substantially covers the under surface of the ferrite 20. The center electrodes 21 to 23 and the common grounding electrode 25 are integrally formed of a conductive material by, for example, punching a metal sheet or etching.

The lower metallic component 4 has a pair of opposing sides 4b and a bottom 4a. The lower metallic component 4 is integrated with the resin component 3 by insert molding to form a case. Two grounding terminals 16 protrude from each side of a pair of opposing sides of the bottom 4a. The upper metallic component 8 is rectangular in plan view, having a top 8a and a pair of opposing sides 8b. The lower metallic component 4 and the upper metallic component 8 are formed by punching and bending a sheet formed of a high permeability material, such as Fe or ferrosilicon, and is followed by plating the surface of the sheet with nickel (typically 1 μm thick) and further with silver (typically 4 μm thick). Nickel plating improves an adherence of the silver plating, and silver plating contributes to the reduction of the insertion loss of the non-reciprocal circuit element 1 because of the high conductivity thereof. The surface color of the lower metallic component 4 and the upper metallic component 8 is silver.

The resin component 3 has a bottom 3a and four sides 3b. The bottom 3a has windows to define a first cell 3c in the center thereof and second cells 3d around the first cell 3c. Each second cell 3d contains one of capacitors C1 to C3 or a resistive element R. The bottom 4a of the lower metallic component 4 is exposed in the first and second cells 3c and 3d. These exposed areas of the bottom 4a serve as grounding-lead-out electrodes 4a.

The resin component 3 is provided with an input terminal 14, an output terminal 15, and an intermediary electrode 17 by insert molding. One end of each of the input terminal 14 and the output terminal 15 extends to the outside of the resin component 3, and the other ends are exposed in the inside of the resin component 3 to serve as an input-lead-out electrode 14a and an output-lead-out electrode 15a. One end of the intermediary electrode 17 is exposed at the bottom 3a of the resin component 3, and the other end is exposed at the bottom in a second cell 3d which contains the resistive element R.

The input-lead-out electrode 14a, the output-lead-out electrode 15a, and the intermediary electrode 17 are formed by nickel plating (typically 1 μm thick) and silver plating (typically 4 μm thick), in that order, on base iron. The surface color of these connection electrodes, that is, the input-lead-put electrode 14a, the output-lead-out electrode 15a, and the intermediary electrode 17 is silver.

The resin member 30 is disposed on the top surface of the center electrode assembly 13. In order to form a short non-reciprocal circuit element 1, the resin member 30 has a hole 30a, in the center thereof, into which the center electrode assembly 13 is fitted. The resin member 30 may not be necessary.

The main materials of the resin member and the resin component 3 are liquid crystalline polymers, polyphenylene sulfide, poly (ether-ether-ketone), and the like because such materials are thermostable and have low dielectric loss factors. The natural colors of the liquid crystalline polymers, polyphenylene sulfide, poly (ether-ether-ketone) are white, dark brown, and brown, respectively. If polyphenylene sulfide or poly (ether-ether-ketone) is used, it is preferable to be colored white; however, it is not necessary to color them when the light reflectance of the material is higher than that of the soldering paste 60. In this embodiment, a liquid crystalline polymer is used for the resin component 3 and the resin member 30 without colorant; hence, the resin component and the resin member are white. In this instance, since a step of coloring the material of the resin component 3 and the resin member 30 is eliminated, the non-reciprocal circuit element 1 can be inexpensive.

The resistive element R has a grounding terminal 18 and a hot-side terminal 19 which are formed on-both sides of an insulating substrate by thick film screen printing and which are separated by a resistor.

The matching capacitors C1 to C3 each have a hot-side capacitor electrode 27 covering the top surface thereof and a cold-side capacitor electrode 28 covering the under surface thereof. The hot-side and cold-side capacitor electrodes 27 and 28 and the terminals 18 and 19 of the resistive element R have a large thickness (typically 15 μm). The surface color of these electrodes 27 and 28 and the terminals 18 and 19 is silver.

Figure 2:
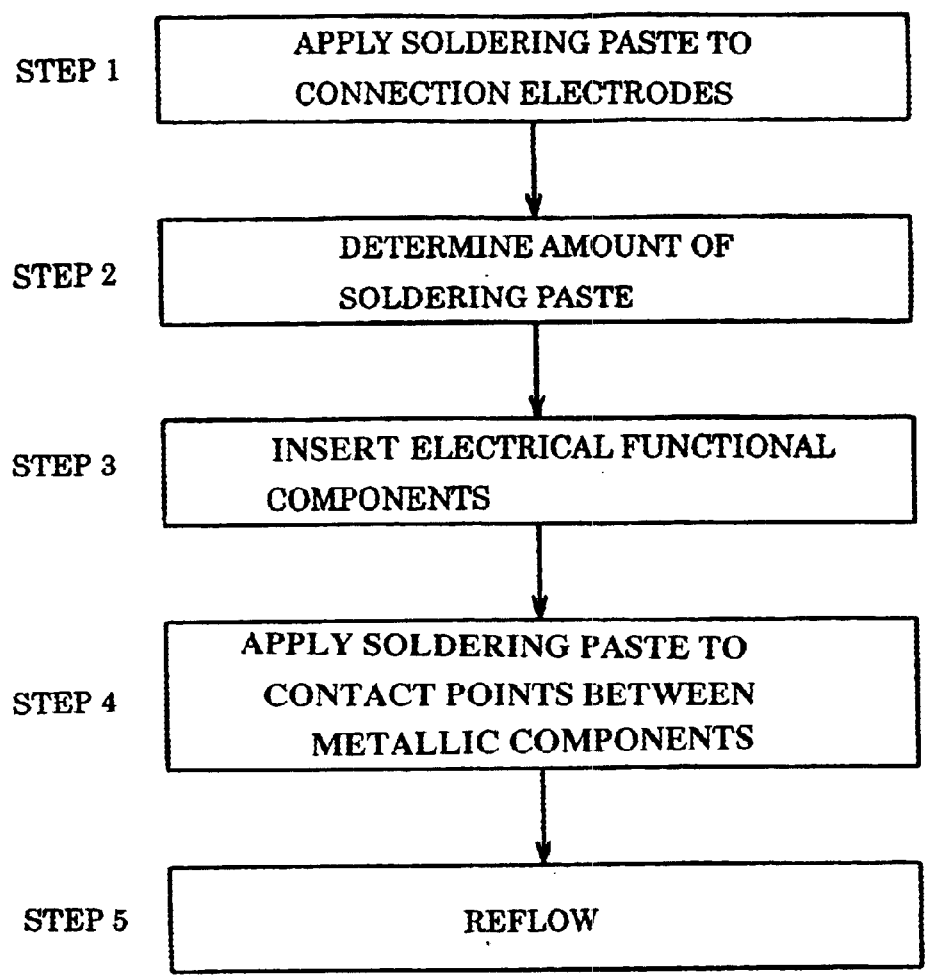
FIG. 2 is a flow diagram of a manufacturing procedure of the non-reciprocal circuit element shown in FIG. 1.
Figure 3:
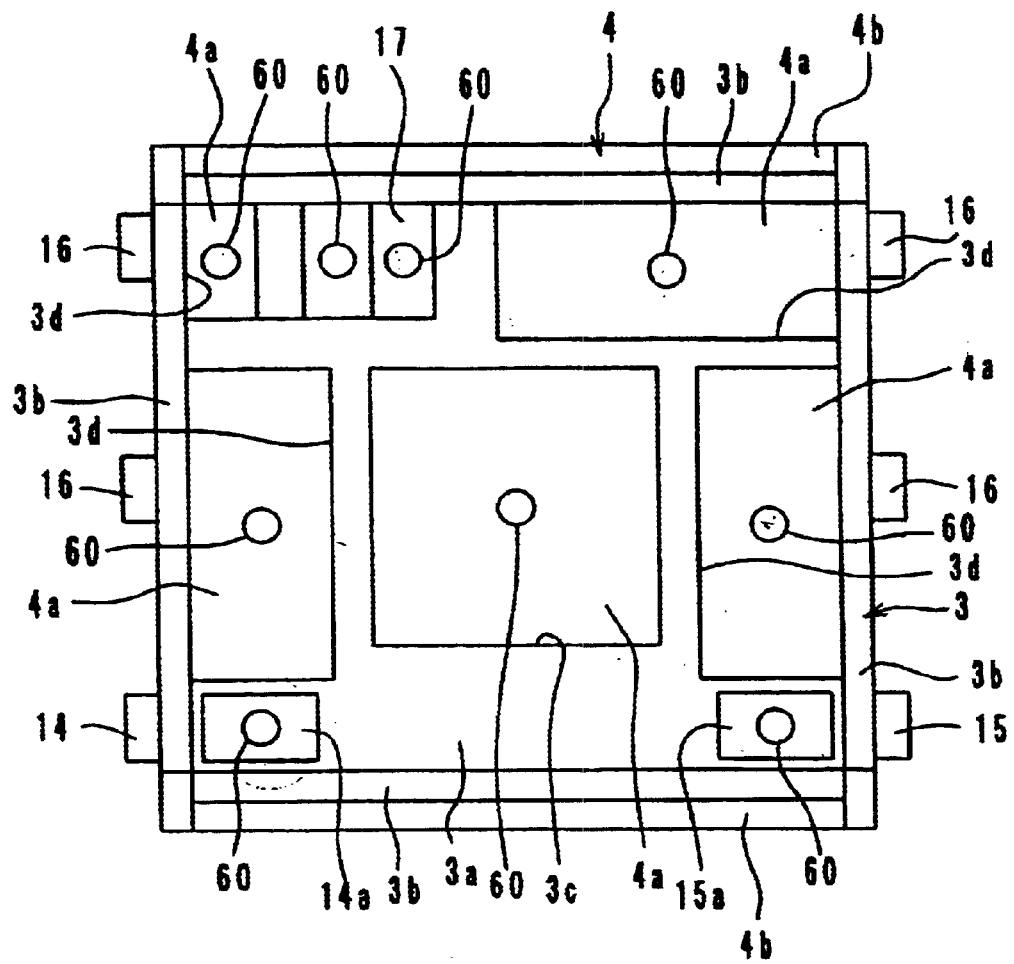
FIG. 3 is a plan view illustrating the manufacturing procedure of the non-reciprocal circuit element shown in FIG. 1.

The components of the non-reciprocal circuit element 1 are assembled in accordance with a procedure shown in FIG. 2. In Step 1, the soldering paste 60 is applied with a dispenser or the like to predetermined positions on connection electrodes (the input-lead-out electrode 14a, the output-lead-out electrode 15a, and the intermediary electrode 17) and the grounding-lead-out electrodes 4a in the first step, as shown in FIG. 3.

The main materials of the soldering paste 60 are Sn—Sb, Sn—Pb, and Sn—Ag. The surface color of the soldering paste is gray. Preferably, Sn—Sb solder, which does not contain lead and has a high melting point, is used in view of environmental protection and reflow soldering efficiency.

The amounts of soldering paste 60 applied to the connection electrodes 14a, 15a, and 17 and the grounding-lead-out electrodes 4a are observed with an image analyzer in the second step. In this embodiment, the surface color of the soldering paste 60 is gray; the surface color of the connection electrodes 14a, 15a, and 17 and the grounding-lead-out electrodes 4a is silver; and the surface color of the bottom 3a of the resin component 3 is white. The light reflectances of the resin component 3 and the connection electrodes 14a, 15a, and 17, therefore, are higher than that of the soldering paste 60. In other words, the reflections at the bottom of 3a of the resin component 3 and the connection electrodes 14a, 15a, and 17 are stronger than the reflection at the soldering paste 60. Accordingly, by setting the threshold for black-and-white binarization in the image analyzer between the level of the image formed by the reflection at the soldering paste 60 and the levels of the images formed by the reflections at the connection electrodes 14a, 15a, and 17 and the resin component 3, the soldering paste 60 can be distinguished from the connection electrodes 14a, 15a, and 17 and the resin component 3. Thus, the amounts of the applied soldering paste 60 can be readily observed.

According to the observation, it is determined in Step 2 whether the soldering paste 60 has been applied within a predetermined range. If the amount is outside the predetermined range, the resin component 3 in question is eliminated from the process and is not sent to the next step. It is then either repaired or thrown out. Thus, a reliable non-reciprocal circuit element 1 can be achieved at a low cost.

Figure 4:
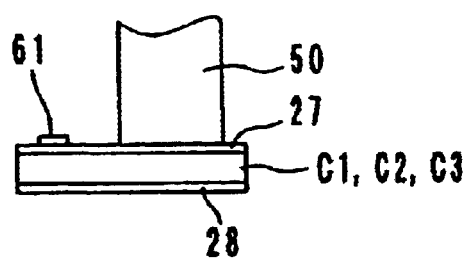
FIG. 4 is an elevation view illustrating the manufacturing procedure following FIG. 3.
Figure 5:
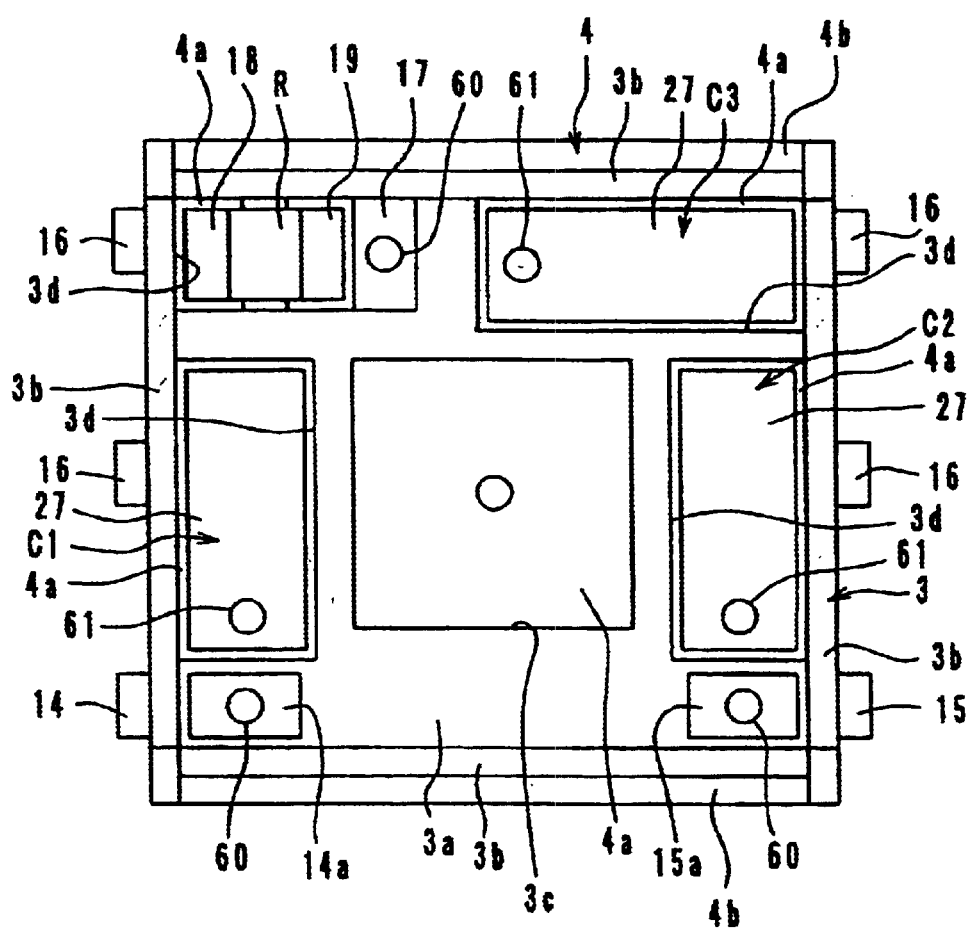
FIG. 5 is a plan view illustrating the manufacturing procedure following FIG. 4.

Next, in Step 3, internal components including the matching capacitors C1 to C3 and the center electrode assembly 13 are inserted in the resin component 3 using an automatic implementation system. The matching capacitors C1 to C3 are previously provided with soldering paste 61 at a predetermined position on the hot-side capacitor electrode 27 by screen printing, as shown in FIG. 4. The automatic implementation system therefore puts a suction nozzle 50 on the hot-side capacitor electrode 27 to lift the capacitor C1, C2, or C3 by suction while avoiding the soldering paste 61. Thus, the matching capacitors C1 to C3 and the resistive element R are disposed on the grounding-lead-out electrodes 4a and the intermediary electrode 17, as shown in FIG. 5.

Figure 6:
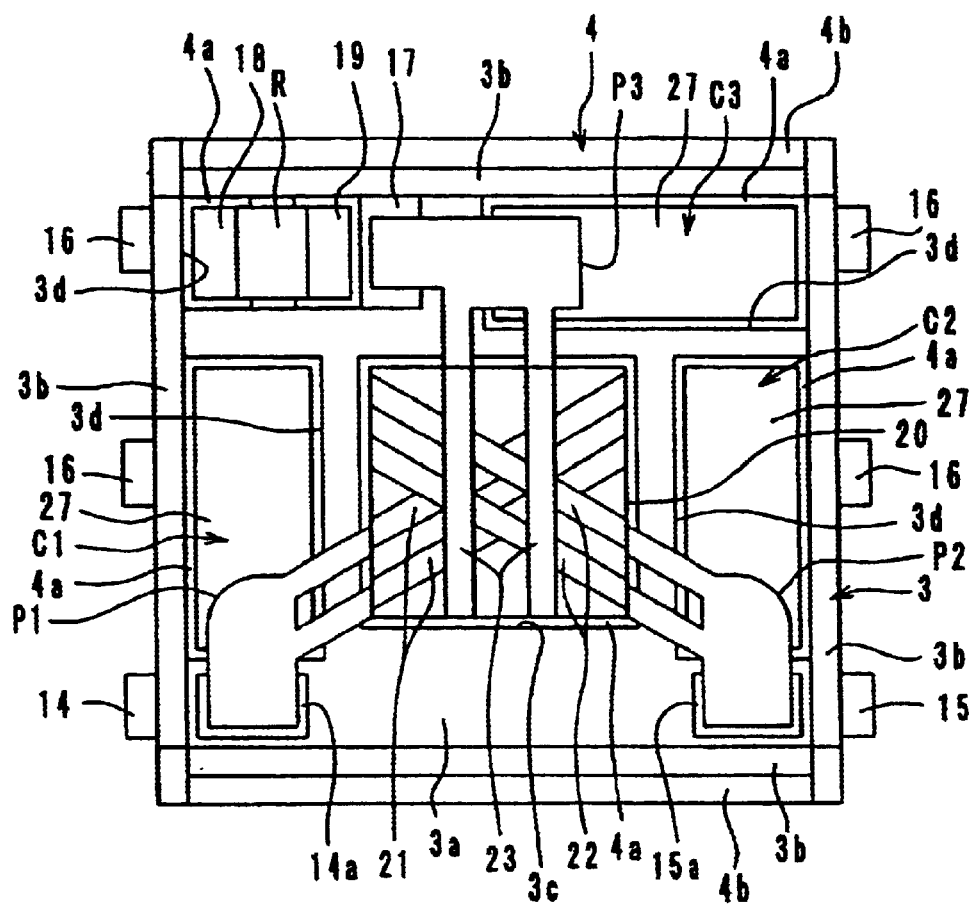
FIG. 6 is a plan view illustrating the manufacturing procedure following FIG. 5.

Turning to FIG. 6, the center electrode assembly 13 is disposed on a grounding-lead-out electrode 4a which is exposed in the first cell 3c. The ports P1 to P3 are each disposed on the corresponding hot-side capacitor electrode 27 and the input-lead-out electrode 14a, the output-lead-out electrode 15a, or the intermediary electrode 17. The interfaces between the ports C1 to C3 and the electrodes 27, 14a, 15a, and 17 are provided with the soldering paste 60 or 61. Next, the resin member 30 and the permanent magnet 9 are incorporated into the region defined by the resin component 3 and the lower metallic component 4 in that order, and are followed by being covered with the upper metallic component 8. The permanent magnet 9 serves to apply direct current flux to the center electrode assembly 13.

Figure 7:
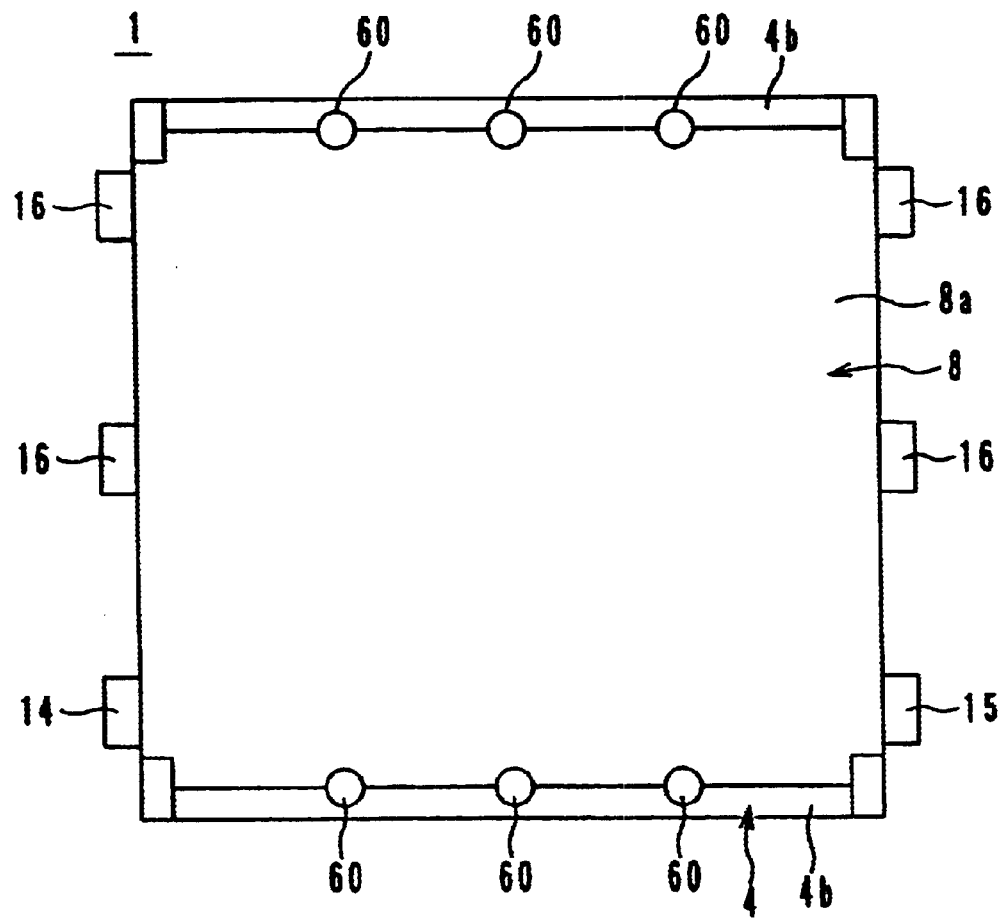
FIG. 7 is a plan view illustrating the manufacturing procedure following FIG. 6.

Turning to FIG. 7, in Step 4, the soldering paste 60 is applied to the points of contact between the lower metallic component 4 and the upper metallic component 8 with a dispenser or the like.

This uncompleted non-reciprocal circuit element 1 is temporarily heated in a reflow oven to melt the soldering paste 60 again, and thus the electrodes and terminals are connected in Step 5. At the same time, the soldering paste 60 applied at points of contact of the lower metallic component 4 and the upper metallic component 8 also is melted to connect the components with each other. The lower metallic component 4 and the upper metallic component 8 form a constituent of a magnetic circuit and serve as a yoke.

After the magnetic characteristics of the permanent magnet 9 when magnetized and demagnetized are adjusted, the non-reciprocal circuit element 1 is subjected to characteristic tests and delivery inspection.

Figure 8:
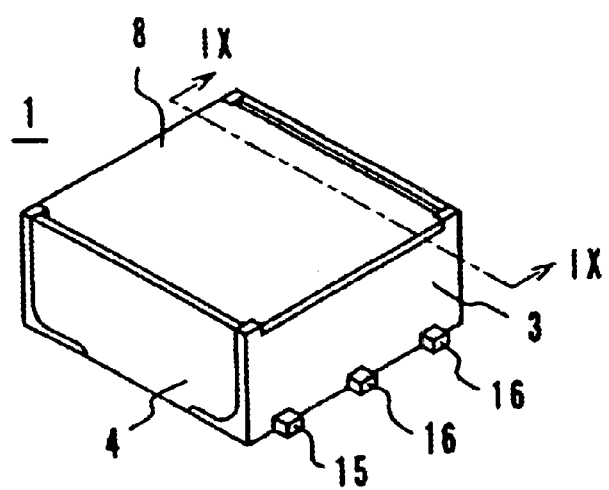
FIG. 8 is a perspective view of a completed non-reciprocal circuit element according to the first embodiment of the present invention.
Figure 9:
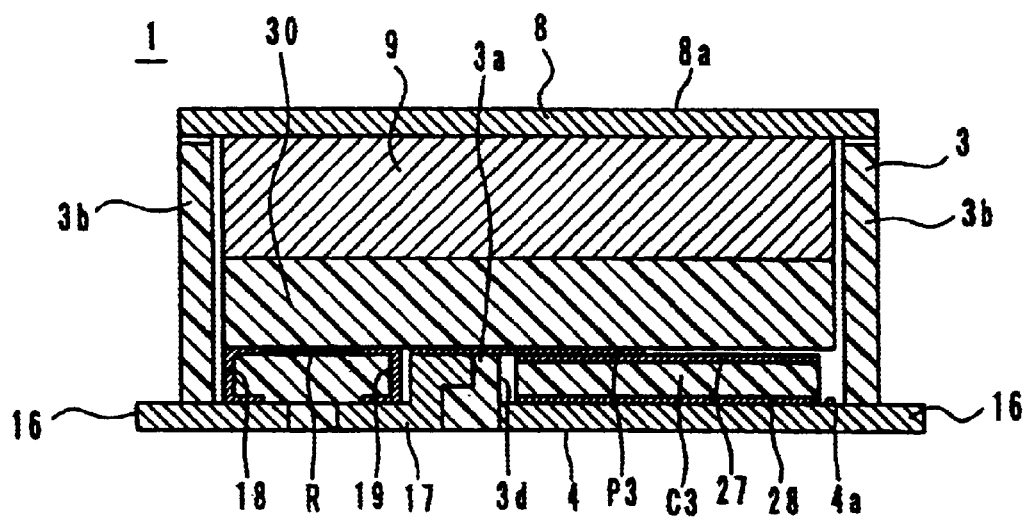
FIG. 9 is a sectional view of the non-reciprocal circuit element taken along the line IX—IX in FIG. 8.
Figure 10:
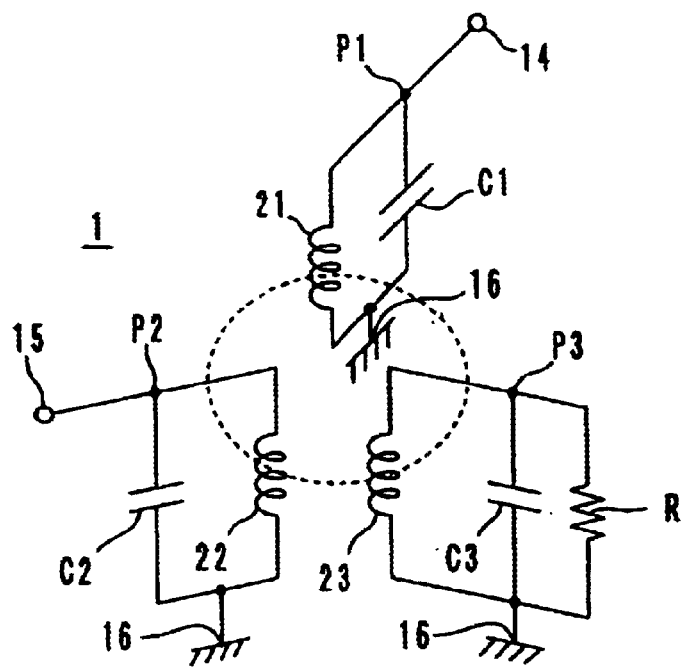
FIG. 10 is an equivalent circuit diagram of the non-reciprocal circuit element shown in FIG. 8.
Figure 11:
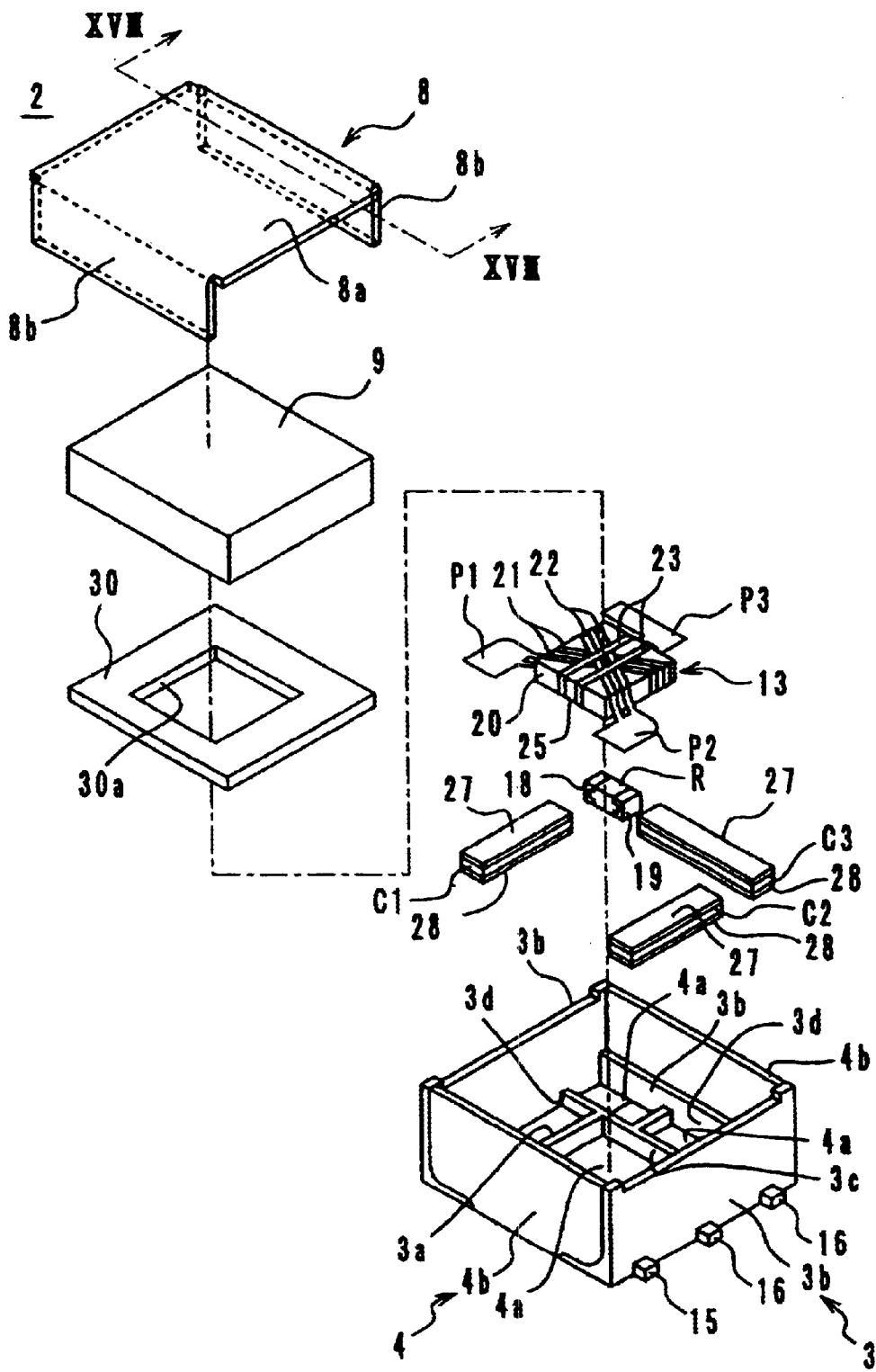
FIG. 11 is an exploded perspective view of a non-reciprocal circuit element according a second embodiment of the present invention.

Thus, the non-reciprocal circuit element 1 shown in FIG. 8 is completed. FIG. 9 is a sectional view of the non-reciprocal circuit element 1 taken along line IX—IX in FIG. 8. The hot-side terminal 19 of the resistive element R is connected with the intermediary electrode 17; hence, the port P3 is electrically connected to both the resistive element R and the matching capacitor C3. Thus, the matching capacitor C3 and the resistive element R are electrically connected with each other in parallel between the port P3 and the grounding terminal 16. FIG. 10 is an equivalent circuit of the non-reciprocal circuit element 1.

In the non-reciprocal circuit element 1, the amounts of the soldering paste 60 applied to the connection electrodes 14a, 15a, 17, and the like can be determined by a monochrome image analyzer, since the soldering paste 60 is distinguishable from the connection electrodes and the other components. In the non-reciprocal circuit element 1, therefore, the amount of soldering paste 60 can be controlled, and consequently, the resulting non-reciprocal circuit element 1 can be made reliable and inexpensive.

Second Embodiment

FIGS. 11 to 18 show a second embodiment of a non-reciprocal circuit element, which is smaller than that of the first embodiment. As the non-reciprocal circuit element for lumped-constant isolators is being miniaturized, the surface area of the hot-side capacitor electrodes 27 of the matching capacitors C1 to C3 become smaller. In this instance, if the soldering paste 61 is previously applied to the hot-side capacitor electrodes 27 by screen printing or the like, the surface area in which the suction nozzle 50 suctions the soldering paste 61 cannot be ensured. A non-reciprocal circuit element 2 according to the second embodiment substantially has the same structure as that of the first embodiment except that the intermediary electrode 17 disposed in the resin component 3 of the first embodiment is eliminated.

The hot-side capacitor electrode 27 and the cold-side capacitor electrode 28 are coated with the same material as used for connection electrodes 14a and 15a. As a result, the thresholds for the determination of the amounts of soldering paste 60 applied to the connection electrodes 14a and 15a and the amount of soldering paste 60 applied to the hot-side capacitor electrodes 27 can be set at the same value, and therefore process control can be facilitated.

The resistive element R has a grounding terminal 18, a hot-side terminal 19, and a resistor. The grounding terminal 18 and the hot-side terminal 19 are formed on both sides of an insulating substrate of the resistive element R by a Sn—Pb solder. The resistor is disposed between the two terminals 18 and 19. The Sn—Pb solder has more luster than the soldering paste 60; hence, the reflections at the terminals 18 and 19 are stronger than the reflection at the soldering paste 60.

The surface color of the resin component 3, the connection electrodes 14a and 15a, and the soldering paste 60 are each the same as in the first embodiment, and are white, silver, and gray, respectively.

Figure 12:
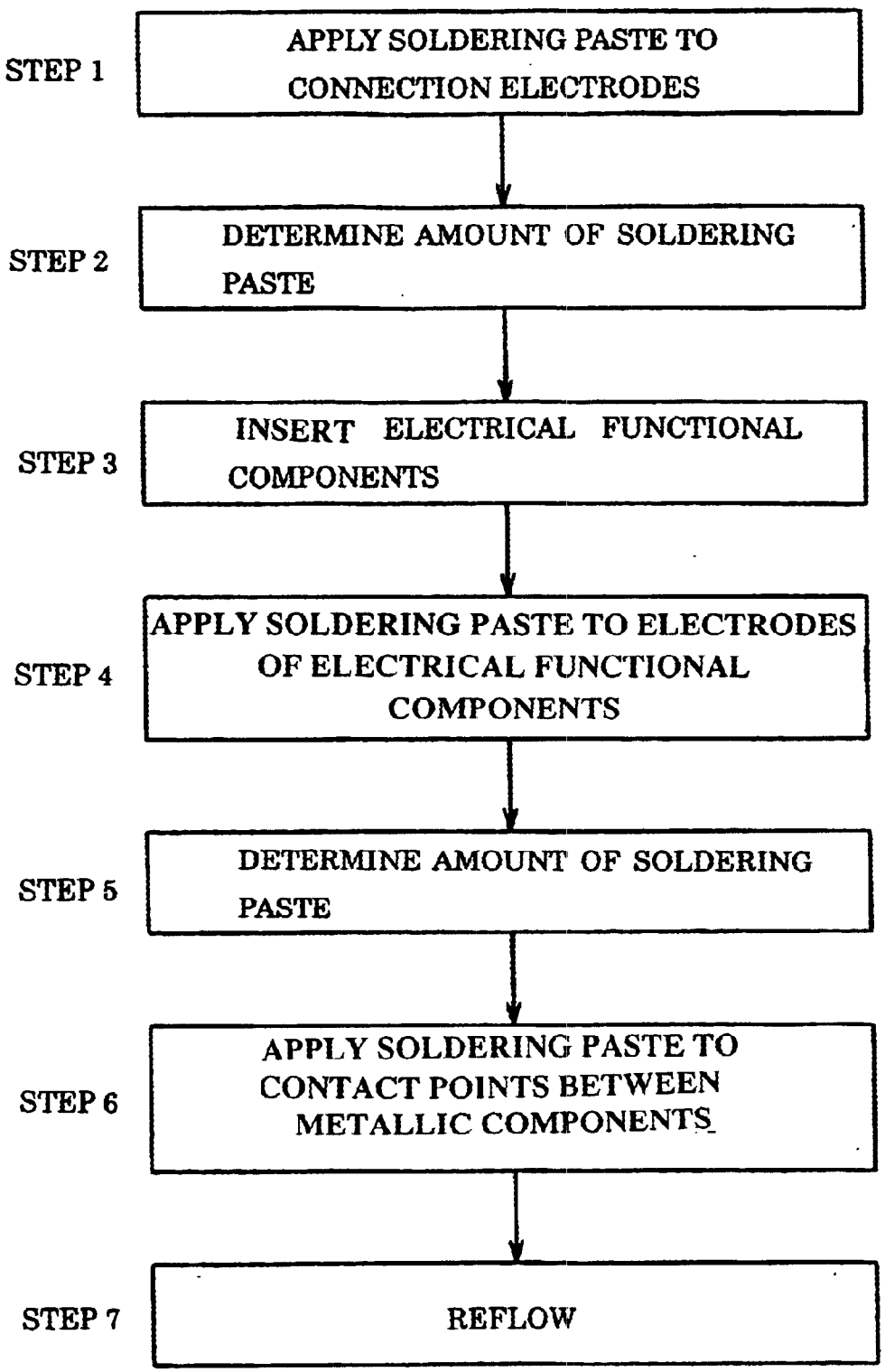
FIG. 12 is a flow diagram of a manufacturing procedure of the non-reciprocal circuit element shown in FIG. 11.
Figure 13:
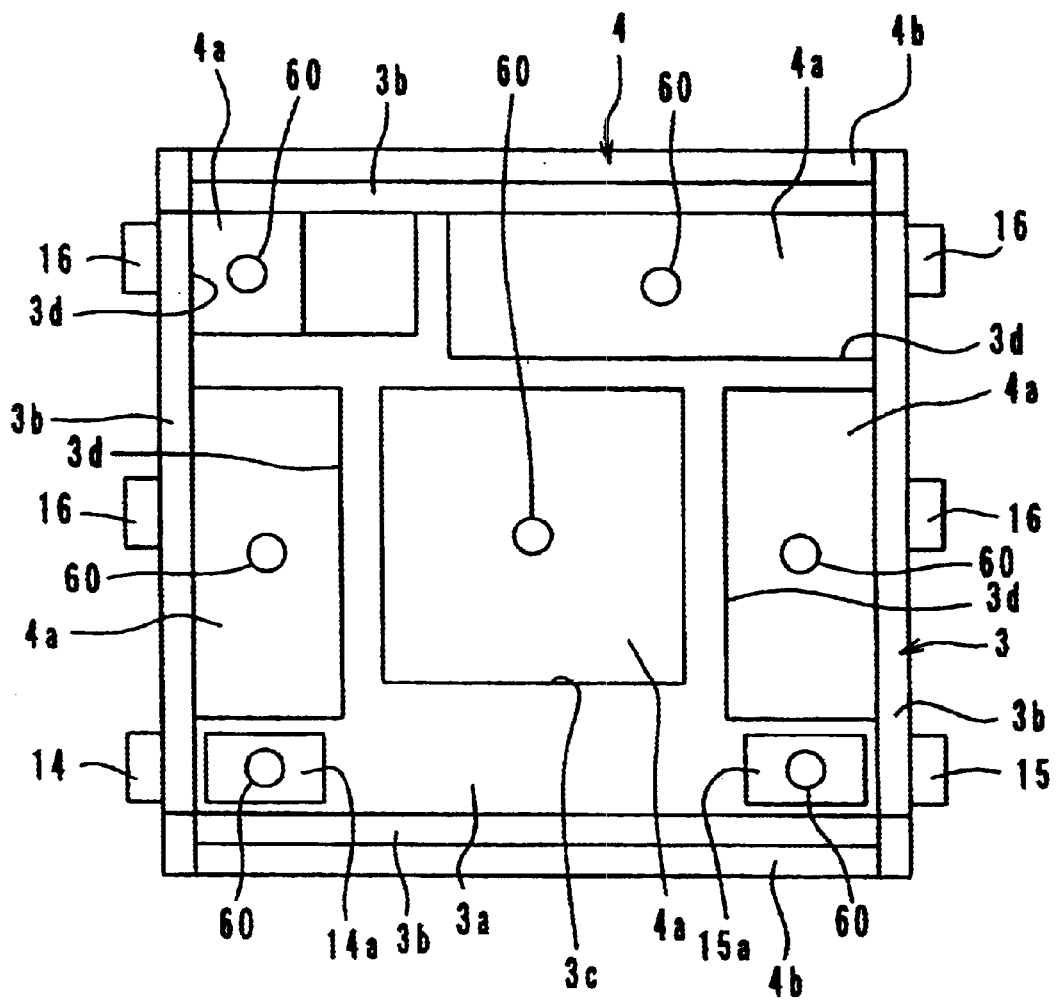
FIG. 13 is a plan view illustrating the manufacturing procedure of the non-reciprocal circuit element shown in FIG. 11.

The components of the non-reciprocal circuit element 2 are assembled in accordance with a procedure shown in FIG. 12. In Step 1, the soldering paste 60 is applied with a dispenser or the like to predetermined positions of connection electrodes (the input-lead-out electrode 14a and the output-lead-out electrode 15a) and the grounding-lead-out electrodes 4a (see FIG. 13).

In Step 2, the amounts of soldering paste 60 applied to the connection electrodes 14a and 15a and the grounding-lead-out electrode 4a are observed with the same image analyzer as in the first embodiment. The threshold for black-and-white binarization is set at the same value as in the first embodiment.

Figure 14:
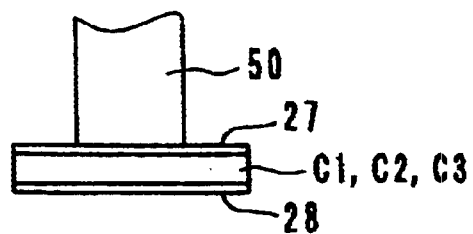
FIG. 14 is an elevation view illustrating the manufacturing procedure following FIG. 13.
Figure 15:
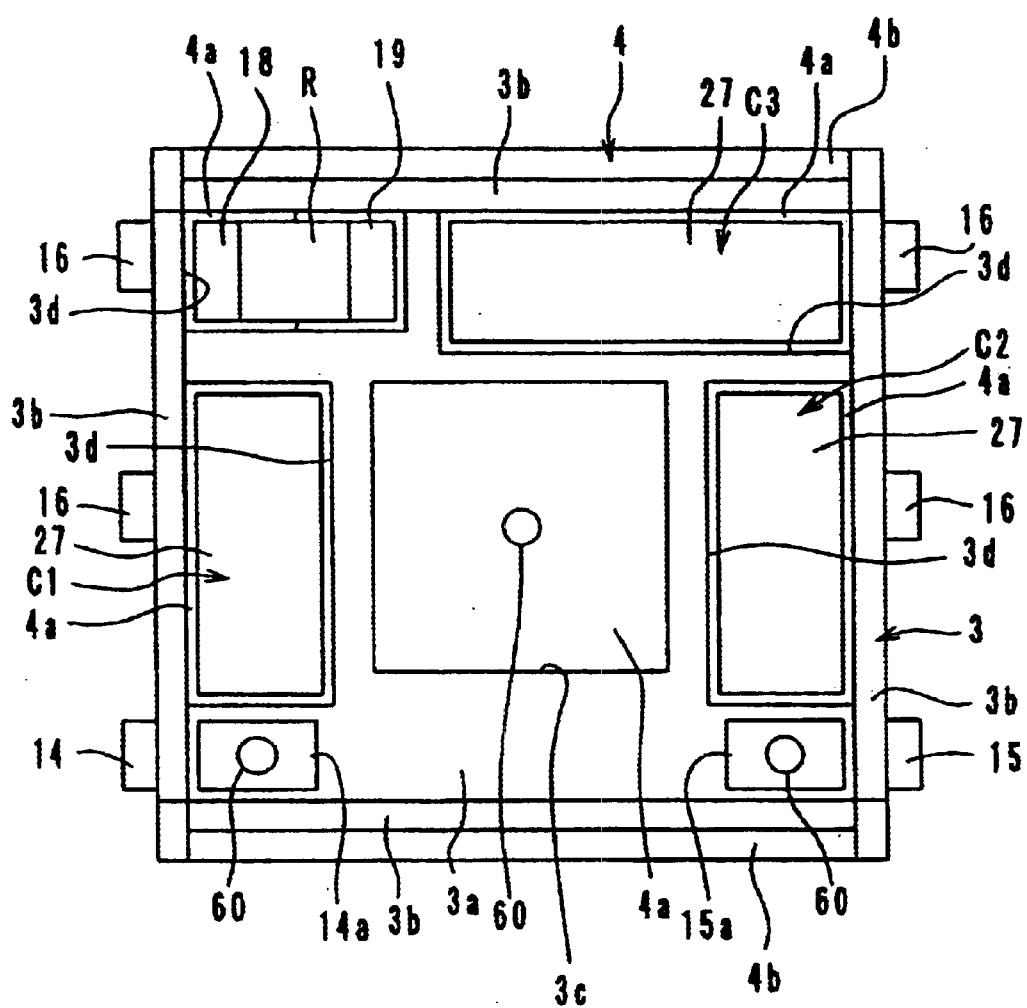
FIG. 15 is a plan view illustrating the manufacturing procedure following FIG. 14.

Next, in Step 3, internal components including the matching capacitors C1 to C3 and the center electrode assembly 13 are inserted in the resin component 3 using an automatic implementation system. In the second embodiment, since the matching capacitors C1 to C3 are small, the surface area of the hot-side capacitor electrodes 27 becomes small and therefore no soldering paste can be applied, as shown in FIG. 14. The automatic implementation system therefore puts the suction nozzle 50 on the center of each hot-side capacitor electrode 27 to lift the capacitor C1, C2, and C3 by suction. Thus, the matching capacitors C1 to C3 and the resistive element R are disposed on the grounding-lead-out electrodes 4a, as shown in FIG. 15.

Figure 16:
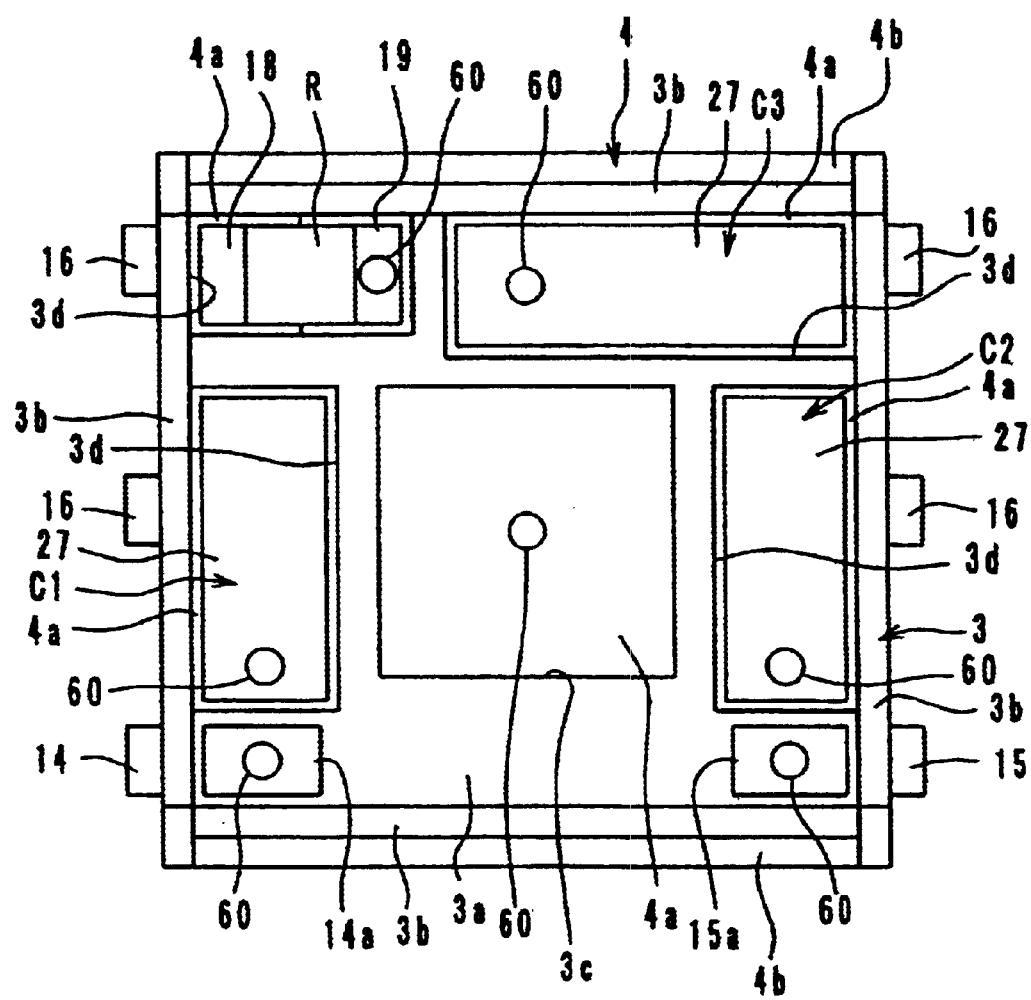
FIG. 16 is a plan view illustrating the manufacturing procedure following FIG. 15.

In Step 4, the soldering paste 60 is applied to predetermined positions on the hot-side capacitor electrodes 27 and the hot-side terminal 19 of the resistive element R, as shown in FIG. 16.

Figure 17:
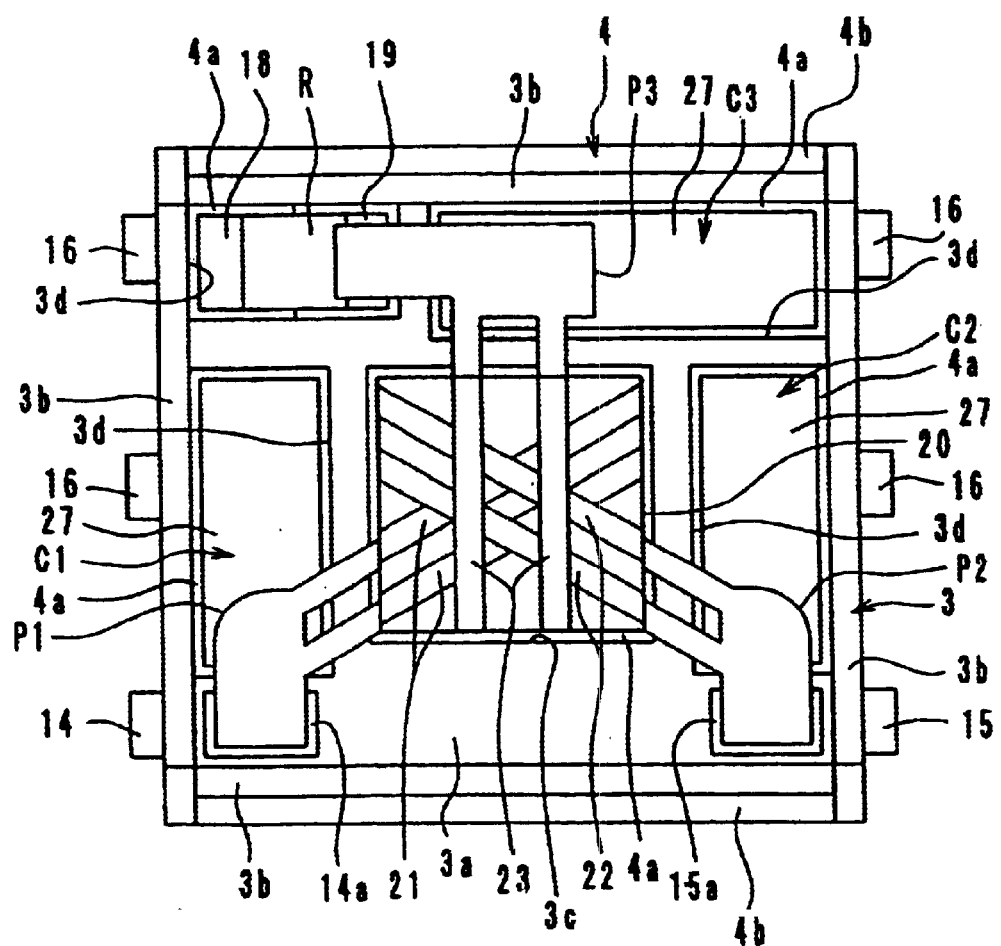
FIG. 17 is a plan view illustrating the manufacturing procedure following FIG. 16.

In Step 5, the amounts of soldering paste 60 applied to the hot-side capacitor electrodes 27 and the hot-side terminal 19 are observed with the image analyzer. Then, the center electrode assembly 13 is disposed on a grounding-lead-out electrode 4a which is exposed in the first cell 3c, as shown in FIG. 17. The ports P1 to P3 are each disposed on the corresponding hot-side capacitor electrode 27 and the input-lead-out electrode 14a, the output-lead-out electrode 15a, or the hot-side terminal 19. The interfaces between the ports C1 to C3 and the electrodes 27, 14a, 15a, and the terminal 19 are provided with the soldering paste 60. Next, the resin member 30 and the permanent magnet 9 are incorporated into the region defined by the resin component 3 and the lower metallic component 4 in that order, and followed by being covered with the upper metallic component 8, as in the first embodiment.

Next, in Step 6, the soldering paste 60 is applied to the contact points of the lower metallic component 4 and the upper metallic component 8 by a dispenser or the like.

This uncompleted non-reciprocal circuit element 2 is temporarily heated in a reflow oven to melt the soldering paste 60 again and thus the electrodes and terminals are connected in Step 7. At the same time, the soldering paste 60 applied to the contact points of the lower metallic component 4 and the upper metallic component 8 also is melted to connect the components with each other.

After the magnetic characteristics of the permanent magnet 9 when magnetized and demagnetized are adjusted, the non-reciprocal circuit element 2 is subjected to characteristic tests and delivery inspection.

Figure 18:
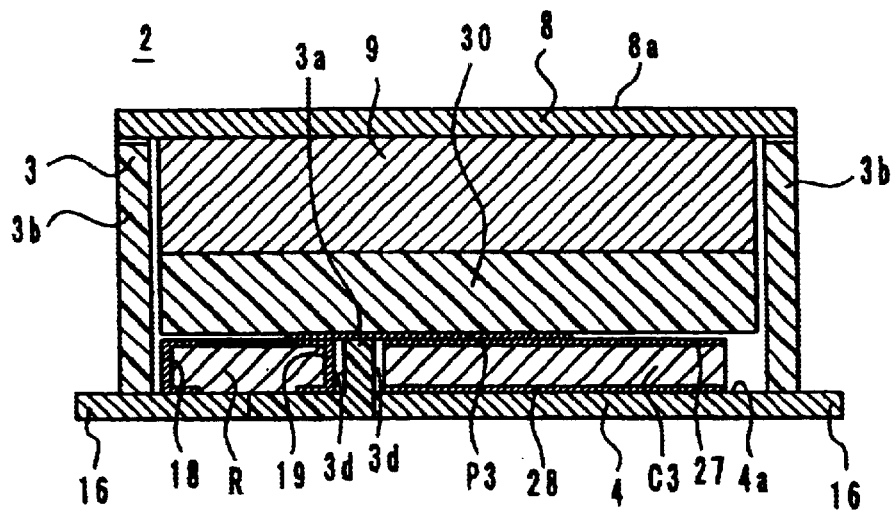
FIG. 18 is a sectional view of the non-reciprocal circuit element taken along the line XVIII—XVIII in FIG. 11.

Thus, the non-reciprocal circuit element 2, or lumped-constant isolator, is completed. The non-reciprocal circuit element 2 shows substantially the same appearance as that of the non-reciprocal circuit element 1 of the first embodiment. FIG. 18 is a sectional view of the non-reciprocal circuit element 2 taken along line XVIII—XVIII in FIG. 11. The hot-side terminal 19 of the resistive element R is directly connected with the port P3.

The non-reciprocal circuit element 2 gives the same effects as the non-reciprocal circuit element 1. In addition, since the hot-side capacitor electrodes 27 are coated with the same material as that of the connection electrodes 14a and 15a, the thresholds for the determination of the amounts of soldering paste 60 applied to the connection electrodes 14a and 15a and the amounts of soldering paste 60 applied to the hot-side capacitor electrodes 27 can be set at the same value. Thus, process control can be facilitated and the non-reciprocal circuit element 2 can be reliable and inexpensive.

Third Embodiment

In a third embodiment, the non-reciprocal circuit element 2 has the same structure as in the second embodiment except that the surface color of the resin component 3, the connection electrodes 14a and 15a, and the hot-side terminal 19 of the resistive element R is black.

The connection electrode 14a and 15a are formed by nickel plating (typically 1 μm thick), silver plating (typically 4 μm thick), and black nickel plating (typically 1 μm thick), in that order, on base iron. Instead of black nickel plating, black nickel-phosphorous plating or black zinc plating may be performed. The surface color of the connection electrodes 14a and 15a is black.

The resin component 3 is also colored black.

The components of the non-reciprocal circuit element 2 of the third embodiment are assembled in accordance with the same procedure as in the second embodiment, and thus completed. In this completed non-reciprocal circuit element 2, the reflections at the connection electrodes 14a and 15a and the bottom 3a of the resin component 3 are weaker than the reflection at the soldering paste 60. By setting a threshold for black-and-white binarization between the image formed by the reflection at the soldering paste 60 and the images formed by the reflections at the connection electrodes 14a, 15a, and the bottom 3a of the resin component 3, therefore, the soldering paste 60 can be readily distinguished from the connection electrodes 14a and 15a and the bottom 3a of the resin component 3. Thus, process control can be facilitated and the non-reciprocal circuit element 2 can be reliable and inexpensive.

Fourth Embodiment

A cellular phone will now be described as an example of a communication device according to the present invention, with respect to FIG. 19.

Figure 19:
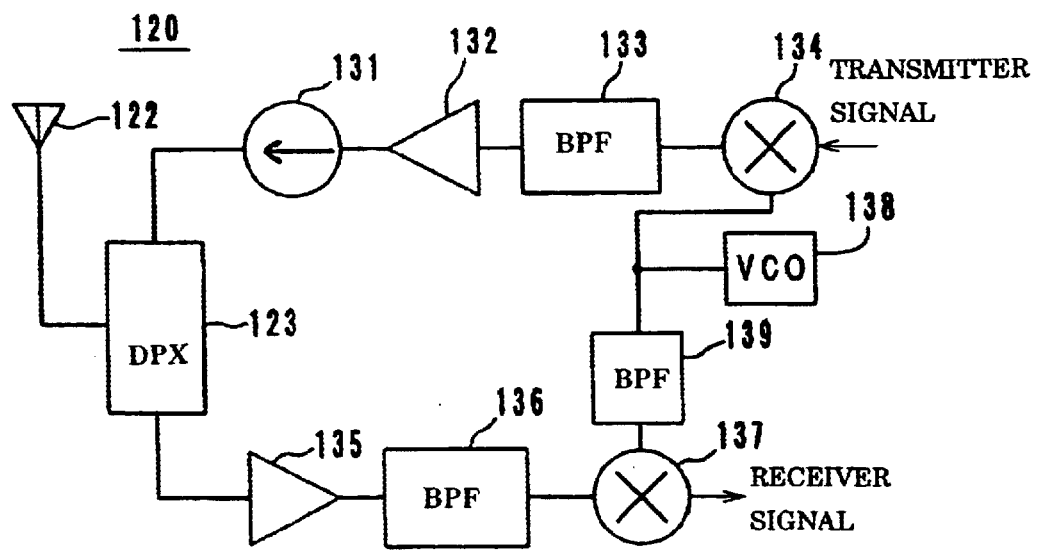
FIG. 19 is a block diagram of a communication device according to an embodiment of the present invention.
Figure 20:
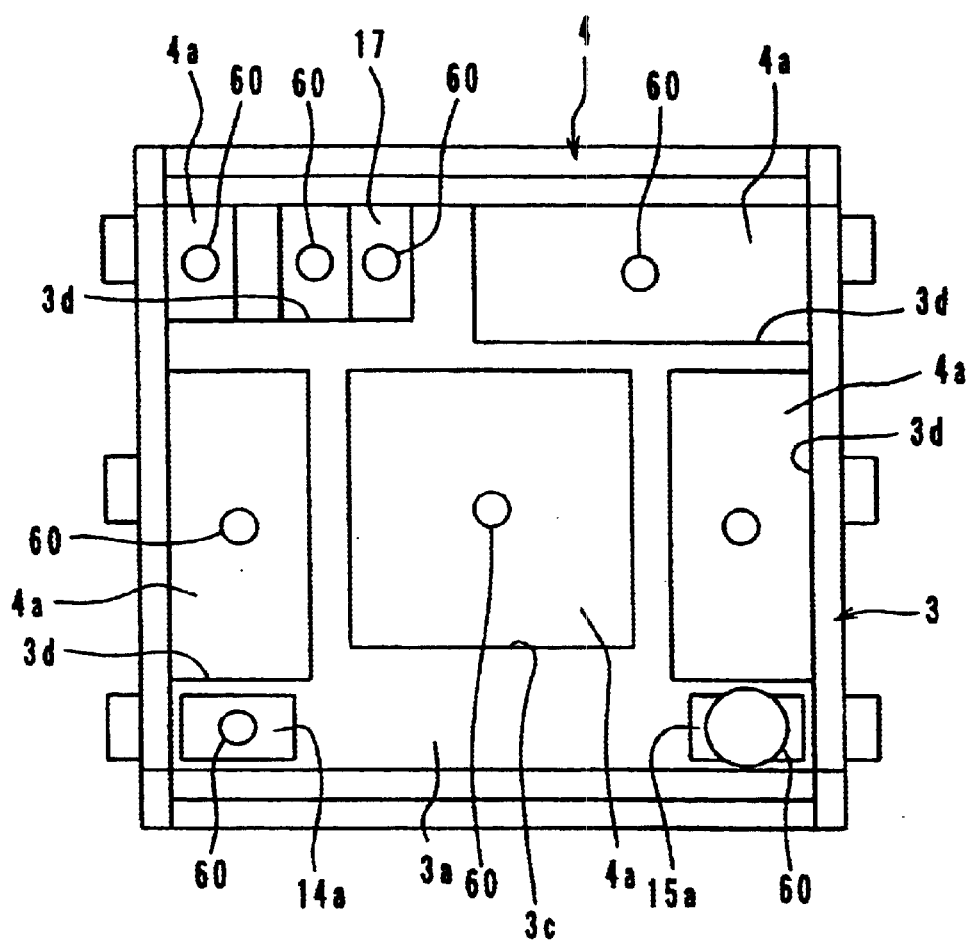
FIG. 20 is a plan view of a resin component of a known non-reciprocal circuit element.

FIG. 19 shows a radio-frequency circuit (RF circuit) 120 of a cellular phone. The RF circuit 120 comprises an antenna element 122, a duplexer 123, a transmission isolator 131, a transmission amplifier 132, a transmission interstage band-pass filter 133, a transmission mixer 134, a reception amplifier 135, a reception interstage band-pass filter 136, a reception mixer 137, a voltage-controlled oscillator (VCO) 138, and a local band-pass filter 139.

The non-reciprocal circuit element 1 or 2 described above is used as the transmission isolator 131. By using the non-reciprocal circuit element 1 or 2, a miniaturized inexpensive cellular phone can be achieved.

However, the non-reciprocal circuit element and the communication device are not limited to the structure of the embodiments described above, and may undergo various changes and modifications without departing from the spirit and scope of the present invention. For example, the lower metallic component 4 and the resin component 3 are not limited to being integrally formed, and may be formed individually and then be combined with each other.

Also, the non-reciprocal circuit element is not limited to use as an isolator, and may be used as a circulator. The center electrodes 21 to 23 may intersect at about 110° to 140° with respect to each other. The ferrite 20, the permanent magnet 9, and the resin member 30 are not limited to being rectangular in plan view, and may have any shape including a circular shape, a rounded-triangular shape, or a deformed polygonal shape.

The connection electrodes 14a, 15a, and 17 are plated with nickel and silver in the embodiments; however, they may be plated with copper instead of nickel. Copper plating leads to a low conductivity and a reduced insertion loss of the non-reciprocal circuit element. Also, only nickel plating or black plating may be applied on the surface of the base of the electrodes so that the manufacturing cost of the non-reciprocal circuit element can be further reduced.

In the embodiments, no colorant is mixed into the resin for the resin component 3. However, any colorant may be added to color the resin component 3, for example, yellow, blue, red, and green, as long as the light reflectance of the resin component 3 is higher than that of the soldering paste 60.

Also, the surface colors of the resin component 3 and the connection electrodes 14a and 15a are not limited to black in the third embodiment. These surfaces may be colored, for example, yellow, blue, red, and green as long as the light reflectances of the resin component 3 and the connection electrodes 14a and 15a are lower than that of the soldering paste 60.

The hot-side capacitor electrodes 27 of the matching capacitors C1 to C3 are coated with the same material as that of the connection electrodes 14a and 15a in the second embodiment. However, the hot-side capacitor electrodes 27 are not limited to being coated and may be formed of the same material as that of the connection electrodes 14a and 15a.

The grounding terminal 18 and the hot-side terminal 19 of the resistive element R are formed on both sides of the insulating substrate thereof by Sn—Pb plating in the second embodiment. However, the terminals may be formed by silver plating.

The center electrodes 21 to 23 are disposed on the surface of the ferrite 20 of the center electrode assembly 13 in the embodiments. However, the center electrodes 21 to 23 may be laminated in a dielectric composite.

The matching capacitors C1 to C3, the resistive element R, and the center electrode assembly 13 are automatically disposed using the suction nozzle 50 of an electronic component implementation system in the embodiments. However, these components may be manually disposed.

The lower metallic component 4 is integrated with the resin component 3 by insert molding to form a case in the embodiments. However, the lower metallic component 4 and the resin component 3 may be a separate lower metallic case and resin case, respectively.

According to the present invention, the light reflectances of the connection electrodes and the resin component are lower or higher than that of the soldering paste. By setting a threshold for black-and-white binarization, therefore, the soldering paste can be distinguished from the connection electrodes and the resin component; hence, the amount of applied soldering paste can be readily determined with an image analyzer. Thus, open circuits and short circuits of the non-reciprocal circuit element can be prevented with a low cost, and therefore, a miniaturized, inexpensive, and reliable non-reciprocal circuit element and communication device can be achieved.

Although the present invention has been described in relation to particular embodiments thereof, many other variations and modifications and other uses will become apparent to those skilled in the art. Therefore, the present invention is not limited by the specific disclosure herein.

What is claimed is:

1. A non-reciprocal circuit element comprising:
   a metallic component;
   a resin component combined with said metallic component;
   a ferrite;
   a permanent magnet applying a DC magnetic flux to said ferrite; and
   a center electrode assembly comprising a plurality of center electrode which are disposed on said ferrite; wherein
      said resin component accommodates said center electrode assembly;
      said resin component has connection electrodes which are connected to said center electrodes by solder;
      said metallic component accommodates the permanent magnet and the center electrode assembly; and
      light reflectances of the connection electrodes and the resin component are higher than that of the solder.

2. A non-reciprocal circuit element comprising:
   a metallic component;
   a resin component combined with said metallic component;
   a ferrite;
   a permanent magnet applying a DC magnetic flux to said ferrite; and
   a center electrode assembly comprising a plurality of center electrode which are disposed on said ferrite; wherein said resin component accommodates said center electrode assembly;

said resin component has connection electrodes which are connected to said center electrodes by solder;

said metallic component accommodates the permanent magnet and the center electrode assembly; and light reflectances of the connection electrodes and the resin component are lower than that of the solder.

3. A non-reciprocal circuit element according to claim 1 or 2, wherein the color of the resin component is not black.

4. A non-reciprocal circuit element according to claim 1, wherein the color of the resin component is white.

5. A non-reciprocal circuit element according to claim 1 or 2, wherein the resin component comprises a colorant-free resin.

6. A non-reciprocal circuit element according to claim 1 or 2, wherein the resin component comprises a material selected from the group consisting of liquid crystalline polymers, polyphenylene sulfide, and poly (ether-ether-ketone).

7. A non-reciprocal circuit element according to claim 1 or 2, wherein the connection electrodes are coated with silver.

8. A non-reciprocal circuit element according to claim 2, further comprising matching capacitors connected to the center electrodes with solder, the matching capacitors comprising capacitor electrodes, wherein the surface material of the capacitor electrodes is the same as that of the connection electrodes.

9. A communication device comprising a non-reciprocal circuit element as set forth in claim 1 or 2.

* * * * *